United States Patent
Huang et al.

(10) Patent No.: US 6,921,716 B2
(45) Date of Patent: Jul. 26, 2005

(54) WAFER BUMPING PROCESS

(75) Inventors: Min-Lung Huang, Kaohsiung (TW); Chi-Long Tsai, Taitung (TW); Chao-Fu Weng, Tainan (TW); Ching-Huei Su, Kaohsiung (TW)

(73) Assignee: Advanced Semiconductor Engineering, Inc., Kaohsing (TW)

( * ) Notice: Subject to any disclaimer, the term of this patent is extended or adjusted under 35 U.S.C. 154(b) by 0 days.

(21) Appl. No.: 10/708,707

(22) Filed: Mar. 19, 2004

(65) Prior Publication Data
US 2004/0185649 A1 Sep. 23, 2004

(30) Foreign Application Priority Data
Mar. 20, 2003 (TW) ........................................ 92106130 A

(51) Int. Cl.⁷ ............................ H01L 21/44; H01L 23/48
(52) U.S. Cl. ........................ 438/613; 438/614; 257/737; 257/780
(58) Field of Search ............................... 438/612, 613, 438/614; 257/737, 738, 750, 762, 780, 781

(56) References Cited

U.S. PATENT DOCUMENTS

| | | | |
|---|---|---|---|
| 6,229,220 B1 * | 5/2001 | Saitoh et al. | 257/780 |
| 6,372,622 B1 * | 4/2002 | Tan et al. | 438/612 |
| 6,750,133 B2 * | 6/2004 | Datta | 438/613 |
| 6,784,087 B2 * | 8/2004 | Lee et al. | 438/612 |

* cited by examiner

Primary Examiner—Kevin M. Picardat
(74) Attorney, Agent, or Firm—Jiang Chyun IP Office

(57) ABSTRACT

A wafer bumping process is disclosed. A wafer having a plurality of bonding pads formed thereon is provided. A first under bump metallurgy layer is formed to cover the bonding pads. A first patterned photoresist layer having a plurality of first openings is formed on the first under bump metallurgy layer, wherein a portion of the first under bump metallurgy layer is exposed within the first openings. A second under bump metallurgy layer is formed within the first openings, wherein the second under bump metallurgy layer is much thicker than the first under bump metallurgy layer. A second patterned photoresist layer having a plurality of second openings is formed on the first patterned photoresist layer, wherein the second openings being larger than the first openings. After filling the second openings with a solder material, a reflowing process is performed to form a plurality of solder bumps, wherein the material of the second under bump metallurgy layer has a melting point higher than that of the solder material.

21 Claims, 4 Drawing Sheets

WAFER BUMPING PROCESS

CROSS REFERENCE TO RELATED APPLICATIONS

This application claims the priority benefit of Taiwan application Ser. No. 92106130, filed on Mar. 20, 2003.

BACKGROUND OF INVENTION

1. Field of the Invention

This invention generally relates to a solder bumping process, and more particularly to a process for forming high bumps by using a thin photoresist layer.

2. Description of the Related Art

The solder bumping process is widely used in flip chip technology. This process comprises forming an under bump metallurgy ("UBM") layer on the bonding pads of the wafer; forming solder bumps on the UBM layer; and connecting the wafer with the substrate via solder bumps. Because the coefficient of expansion of the chip is different from that of the substrate, solder bumps receive more shear stress when the gap between the chip and the substrate is small. Hence, this reduces solder bumps" mechanical reliability.

Therefore, higher solder bumps are needed to increase the distance between the substrate and the chip to reduce the shear stress.

FIGS. 1–2 show a prior art process of forming high bumps. Referring to FIG. 1, a passivation layer 104 is formed to cover the surface of the wafer 100 and to expose the bonding pad 102. A UBM layer 106 is formed to cover the passivation layer 104 and the boding pad 102. Then the patterned photoresist layers 108 and 110 are formed on the UBM layer 106. The solder material 112 is filled into the opening that is formed by the patterned photoresist layers 108 and 110. By increasing the thickness of the photoresist layers 108 and 110, the depth of the resulting opening becomes larger and more solder material 112 can be filled into the opening. The width of the opening of the photoresist layer 108 is around 100~120 $\mu$m. The thickness of the photoresist layers 108 and 110 is around 100 $\mu$m.

Referring to FIG. 2, the photoresist layers 110 and 108, and a portion of the UBM layer 106 are removed. Then the solder bump 112a is formed after the reflow step.

In this prior art process, because the opening of each patterned photoresist layer is small, multiple layers of patterned photoresist layers are stacked to form deeper openings. Thus, more solder material can be filled into the opening. However, using the current photolithographic techniques to form a deep (100~140 $\mu$m) and small opening (<100 $\mu$m) is very difficult, thus resulting in a lower reliability and yields.

SUMMARY OF INVENTION

An object of the present invention is to provide a wafer bumping process by at least using a thinner photoresist layer with a bigger opening to form a high solder bump.

Another object of the present invention is to provide a wafer bumping process to form at least a high bump thereby increasing the distance of the substrate and the wafer and thus reducing the shear stress received by the bump and thereby increasing its mechanical reliability.

The present invention provide a wafer bumping process, comprising the steps of: providing a wafer including a plurality of bonding pads and a passivation layer thereon, the passivation layer covering the surface of the wafer and exposing the bonding pads; forming a first under bump metallurgy layer covering the passivation layer and the bonding pads; forming a first patterned photoresist layer on the first under bump metallurgy layer, the first patterned photoresist layer including a plurality of first openings corresponding to the bonding pads and exposing a portion of the first under bump metallurgy layer; forming a second under bump metallurgy layer within the first openings; forming a second patterned photoresist layer on the first patterned photoresist layer, wherein the second patterned photoresist layer comprises a plurality of second openings, wherein the second openings are larger than the first openings to expose a portion of the second under bump metallurgy layer; filling the second openings with a solder material and the solder material covering the exposed portion of the second under bump metallurgy layer; reflowing the solder material to form a plurality of solder bumps; removing the second patterned photoresist layer and the first patterned photoresist layer to expose a portion of the first under bump metallurgy layer; and removing the exposed portion of the first under bump metallurgy layer.

In the present invention, the step of filling the solder material can use the electroplating method, the ball-mounting process or the printing method, and the shape of the second openings can be of any shape, such as round, quadrilateral or multilateral, so long as the second openings can expose at least a portion of the second under bump metallurgy layer. For example, the second openings can be canted to expose a portion of the second under bump metallurgy layer.

According to one aspect of the present invention, the size of the second openings is larger than that of the first openings to expose a portion of the second under bump metallurgy layer so that, during the reflow process, the solder material uses the second under bump metallurgy layer as bases to form bumps with a height higher than the second patterned photoresist layer.

Therefore, the size of second openings can be adjusted according to the amount of the solder material. For example, the size of second openings can be bigger to accommodate more solder material if the second patterned photoresist layer is thinner. This also reduces the err rate because forming a thinner photoresist layer having a bigger opening is much easier than forming a thicker photoresist layer having a smaller and deeper opening for the photolithography process.

Moreover, the second under bump metallurgy layer is made of a material that is not melted when the solder material is reflowed. For example, a material of the second under bump metallurgy layer includes nickel or copper. In addition, unlike the prior art using thicker photoresist layers to form high solder bumps, the present invention can use thinner photoresist layers to form high solder bumps due to the thicker second under bump metallurgy layer. Namely, the thickness of the second under metallurgy layer is much larger than the first under metallurgy layer.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

<First Embodiment of the Present Invention>

Figure 1:
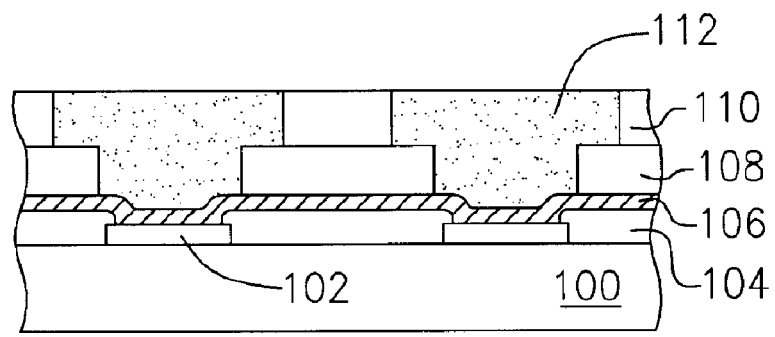
FIGS. 1–2 show cross-sectional view of process steps of a prior art wafer bumping process.
Figure 2:
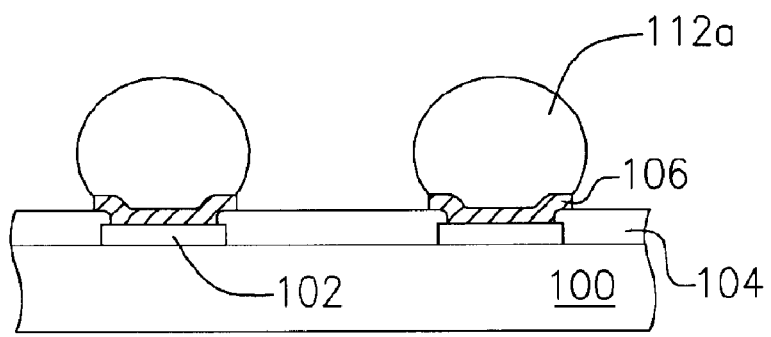
Figure 3:
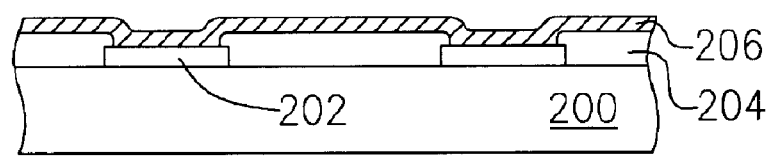
FIGS. 3–10 show cross sectional views of process steps of a wafer bumping process in accordance with the first embodiment of the present invention.

FIGS. 3–10 show cross sectional views of process steps of a wafer bumping process in accordance with the first embodiment of the present invention. Referring to FIG. 3, a substrate 200, such as a wafer is provided. The wafer (substrate) having at least an active surface. The wafer 200 comprises a plurality of bonding pads 202 and a passivation layer 204 covering the wafer surface (active surface) and exposing the bonding pads 202. A first under bump metallurgy layer 206 is formed to cover the passivation layer 204 and the bonding pads 202 serve as a seed layer for the subsequent electroplating process. In a preferred embodiment of the present invention, the first under bump metallurgy layer 206 is formed by using a sputtering deposition method. The first under bump metallurgy layer 206 is selected from the group of materials consisting of Cr, Ti, Ti—W alloy, Cu, Ni, Cr—Cu alloy, Ni—V alloy, Ni—Au alloy, and Al. For example, the first under bump metallurgy 206 can be a composite layer including a titanium (Ti) layer, a nickel-vanadium (Ni—V) alloy layer and a copper (Cu) layer. In general, the first under ball metallurgy layer has a thickness less than 10 $\mu$m.

Figure 4:
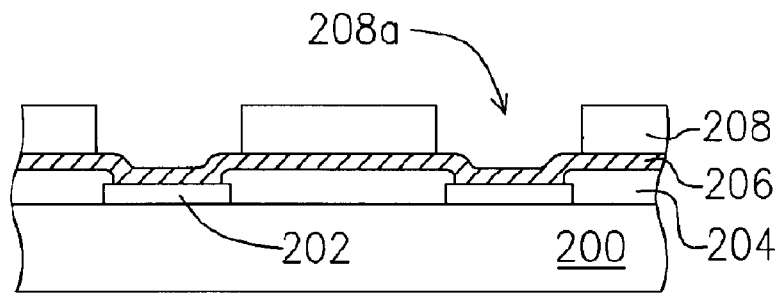

Referring to FIG. 4, a first patterned photoresist layer 208 is formed on the first under bump metallurgy layer 206. The first patterned photoresist layer 208 comprises a plurality of first openings 208a corresponding to the bonding pads 202 that expose a portion of the first under bump metallurgy layer 206. The thickness of the first patterned photoresist layer 208 is around 30–75 $\mu$m. The critical dimension of the first openings is around 160–250 $\mu$m.

Figure 5:
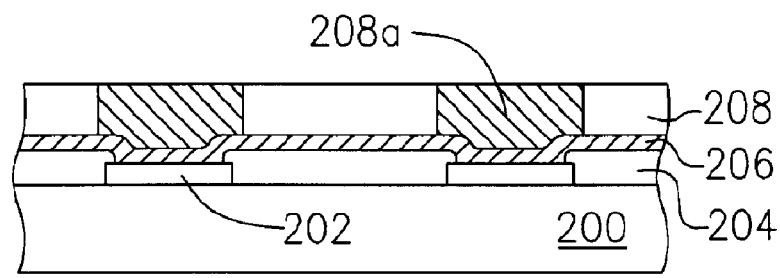

Referring to FIG. 5, a second under bump metallurgy layer 210 is formed within the first openings 208a and over the first under bump metallurgy layer 206. For example, the second under ball metallurgy layer 210 is formed by electroplating using the first under bump metallurgy layer 206 as a seed layer. In a preferred embodiment of the present invention, the second under bump metallurgy layer has a height much larger than that of the first under bump metallurgy.

Figure 6:
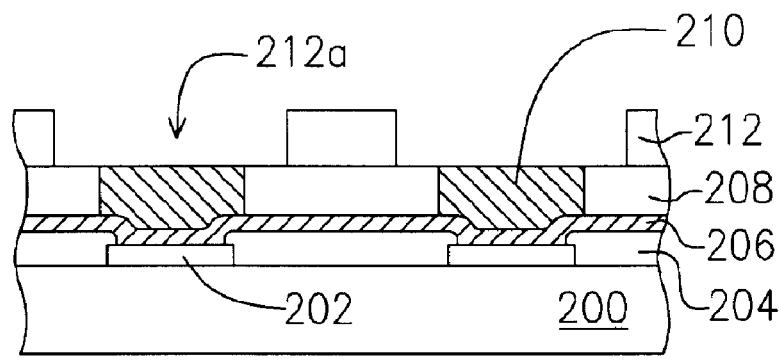

Referring to FIG. 6, a second patterned photoresist layer 212 having a thickness of around 30–75 $\mu$m is formed on the first patterned photoresist layer 208. The second patterned photoresist layer 212 includes a plurality of second openings 212a. The size of the second openings 212a is larger than that of the first openings 208a in order to expose the second under bump metallurgy layer 210.

Figure 7:
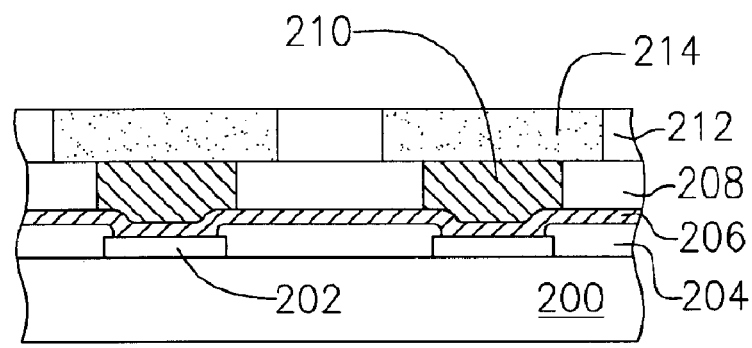

Referring to FIG. 7, the second openings 212a are filled with a solder material 214. The solder material 214 covers the exposed portion of the second under bump metallurgy layer 210. In a preferred embodiment of the present invention, the second under bump metallurgy layer 210 is made of a material with a melting point higher than that of the solder material. For example, the material of the second under bump metallurgy layer includes nickel (Ni) or copper (Cu); and the material of the solder material can be a Sn—Pb alloy, a high lead solder, or a Sn—Ag—Cu alloy. The solder material 214 is disposed and filled into the second openings 212a by, for example, the electroplating method, the ball-mounting process or the printing method. In addition, when the material of the solder bump is made of gold, the melting point of the gold bump shall be lower than the second under bump metallurgy layer.

Figure 8:
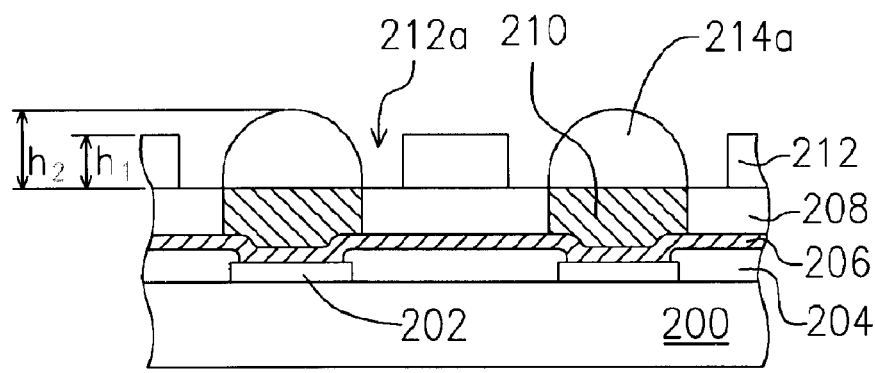

Referring to FIG. 8, a reflow process is performed to transform the solder material 214 into a plurality of solder bumps 214a. Because the melting point of the second under bump metallurgy is higher than that of the solder material, the second under bump metallurgy layer is not melted during the reflowing of the solder material. Furthermore, the size of the second openings 212a is larger than that of the first openings 208a. Accordingly, the solder material 214 uses the second under bump metallurgy layer 210 as bases to form solder bumps 214a with a height higher than the second patterned photoresist 212 layer (i.e. the height (h2) of the solder bumps is larger than the thickness (h1) of the second patterned photoresist 212 layer). The solder bumps formed by the processes of this invention are higher than the solder bumps formed through conventional processes, by using a thinner-patterned photoresist layer for the solder material.

Figure 9:
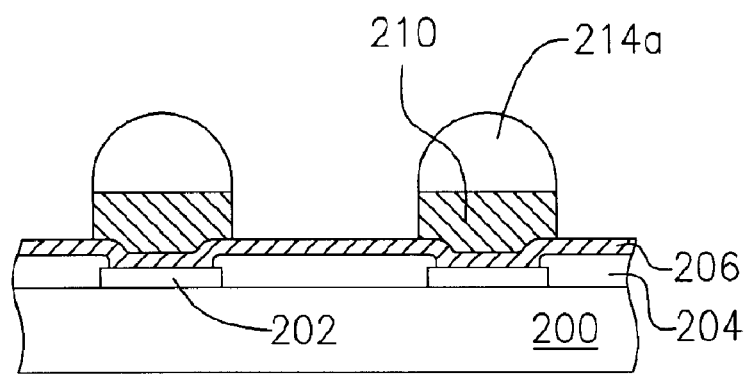

Referring to FIG. 9, the second patterned photoresist layer 212 and the first patterned photoresist layer 208 are removed to expose a portion of the first under bump metallurgy layer 206. Then, referring to FIG. 10, the exposed portion of the first under bump metallurgy layer 206 is removed.

<Second Embodiment of the Present Invention>

Figure 10:
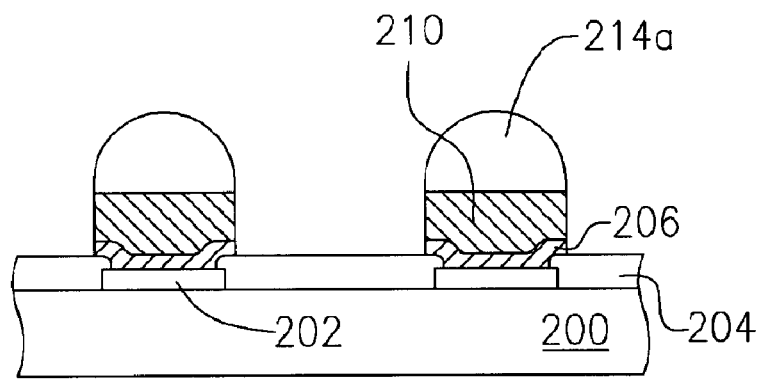
Figure 11:
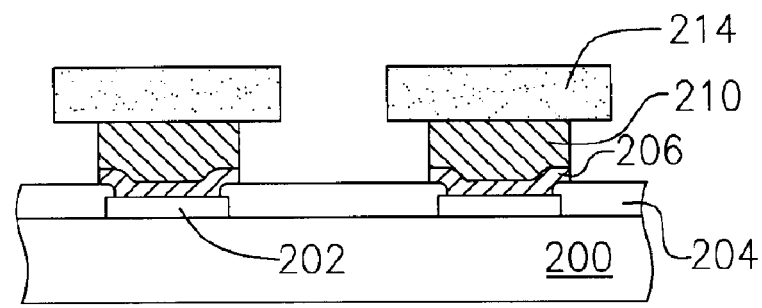
FIG. 11 shows a modified example of the present invention when the openings are filled with solder material by using an electroplating method.

In the first embodiment of the present invention, if the openings are filled with solder material 214 by an electroplating method, then the aforementioned bumping process can be performed in a slightly different way. Such as the following, the second patterned photoresist layer 212 and the first patterned photoresist layer 208 are removed first to expose a portion of the first under bump metallurgy layer 206. Then, the exposed portion of the first under bump metallurgy layer 206 is removed (shown in FIG. 11). Then as shown in FIG. 10, the reflow process is performed to turn solder material 214 into a plurality of solder bumps 214a.

Furthermore, the step of removing the exposed portion of the first under bump metallurgy layer 206 can be performed after the solder bumps 214a have been formed.

Figure 12:
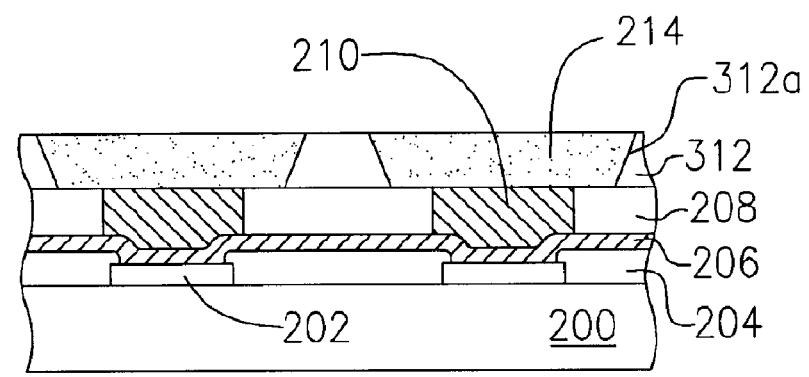
FIG. 12 shows a modified example of the openings in accordance with the second preferred embodiment of the present invention.

In the present invention, the shape of the second openings can be of any shape, such as round, quadrilateral or multilateral, or even with slanting sidewalls, so long as the second openings can expose at least a portion of the second under bump metallurgy layer. For example, in FIG. 12, the second openings 312a taper towards the underlying second under bump metallurgy layer 210 to expose at least a portion of the second under bump metallurgy layer 210.

According to one major aspect of the present invention, the second under bump metallurgy layer is made of a material that is not melted when the solder material is reflowed and the size of the second openings is larger than that of the first openings to expose a portion of the second under bump metallurgy layer so that, during the reflow process, the solder material uses the second under bump metallurgy layer as bases to form higher bumps. Compared with the solder bumps formed through conventional processes, the solder bump provided by the present invention has a higher height, using the thinner patterned photoresist layer for defining the volume of the solder material.

As mentioned above, therefore, the size of second openings can be adjusted according to the amount of the solder material. For example, if the second patterned photoresist layer is designed to be thinner, the size of second openings can be designed to be bigger to accommodate the same amount of the solder material. This also reduces the err rate because forming a thinner photoresist layer having a bigger opening is much easier than forming a thicker photoresist layer having a smaller and deeper opening for the photography process.

Unlike the prior art using thicker photoresist layers to form high solder bumps, the present invention uses thinner photoresist layers to form high solder bumps.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A wafer bumping process, comprising the steps of:
   providing a wafer, said wafer comprising a plurality of bonding pads and a passivation layer covering a surface of said wafer and exposing said bonding pads;
   forming a first under bump metallurgy layer covering said passivation layer and said bonding pads;
   forming a first patterned photoresist layer on said first under bump metallurgy layer, said first patterned photoresist layer comprising a plurality of first openings corresponding to said bonding pads and exposing a portion of said first under bump metallurgy layer;
   forming a second under bump metallurgy layer within said first openings;
   forming a second patterned photoresist layer on said first patterned photoresist layer, said second patterned photoresist layer comprising a plurality of second openings, said second openings being larger than said first openings to expose a portion of said second under bump metallurgy layer;
   filling said second openings with a solder material, wherein the solder material covers said exposed portion of said second under bump metallurgy layer;
   reflowing said solder material to form a plurality of solder bumps;
   after reflowing said solder material, removing said second patterned photoresist layer and said first patterned photoresist layer to expose a portion of said first under bump metallurgy layer; and
   removing said exposed portion of said first under bump metallurgy layer.

2. The wafer bumping process of claim 1, wherein the step of filling said solder material includes printing.

3. The wafer bumping process of claim 1, wherein the step of filling said solder material includes electroplating.

4. The wafer bumping process of claim 1, wherein sidewalls of said second openings are slanting and said second openings expose said portion of said second under bump metallurgy layer.

5. The wafer bumping process of claim 4, wherein said second openings taper towards said second under bump metallurgy layer within said first openings to expose said portion of said second under bump metallurgy layer.

6. The wafer bumping process of claim 1, wherein said the step of forming first under bump metallurgy layer includes sputtering deposition.

7. The wafer bumping process of claim 1, wherein the step of forming second under bump metallurgy layer includes electroplating.

8. The wafer bumping process of claim 1, wherein a material of said first under bump metallurgy layer is selected from the group of materials consisting of Cr, Ti, Ti—W alloy, Cu, Ni, Cr—Cu alloy, Ni—V alloy, Ni—Au alloy, and Al.

9. The wafer bumping process of claim 1, wherein a thickness of the said second under bump metallurgy layer is about 30–75 μm.

10. The wafer bumping process of claim 1, wherein a material of said second under bump metallurgy layer having a melting point larger than a melting point of said solder material.

11. The wafer bumping process of claim 10, wherein a material of said second under bump metallurgy layer includes Cu.

12. The wafer bumping process of claim 10, wherein a material of said second under bump metallurgy layer includes Ni.

13. The wafer bumping process of claim 1, wherein a material of said solder material includes a Sn—Pb alloy.

14. The wafer bumping process of claim 1, wherein a material of said solder material includes a Sn—Ag—Cu alloy.

15. The wafer bumping process of claim 1, wherein a material of said solder material includes a high lead solder.

16. A structure of bumps comprising:
   a substrate having at least an active surface;
   a plurality of bonding pads formed on the active surface;
   a passivation layer formed over the active surface of the substrate, wherein portions of the bonding pads are exposed by the passivation layer;
   a first under bump metallurgy layer formed on the exposed portions of the bonding pads;
   a second under bump metallurgy layer formed on the first under bump metallurgy layer; and
   a plurality of solder bumps formed on the second under bump metallurgy layer without covering sidewalls of the second under bump metallurgy layer, wherein a melting point of the solder bumps is lower than a melting point of the second under bump metallurgy layer.

17. The structure of claim 16, wherein a material of the second under bump metallurgy layer includes Cu.

18. The structure of claim 16, wherein the second under bump metallurgy layer is a nickel layer.

19. The structure of claim 16, wherein a thickness of the second under bump metallurgy layer is larger than that of the first under bump metallurgy layer.

20. The structure of claim 16, wherein a thickness of the second under bump metallurgy is about 30–75 μm.

21. The structure of claim 16, wherein the first under bump metallurgy is composed of Ti, Ni—V alloy and Cu and directly formed on the exposed portions of the bonding pads.

* * * * *